Figure 1:
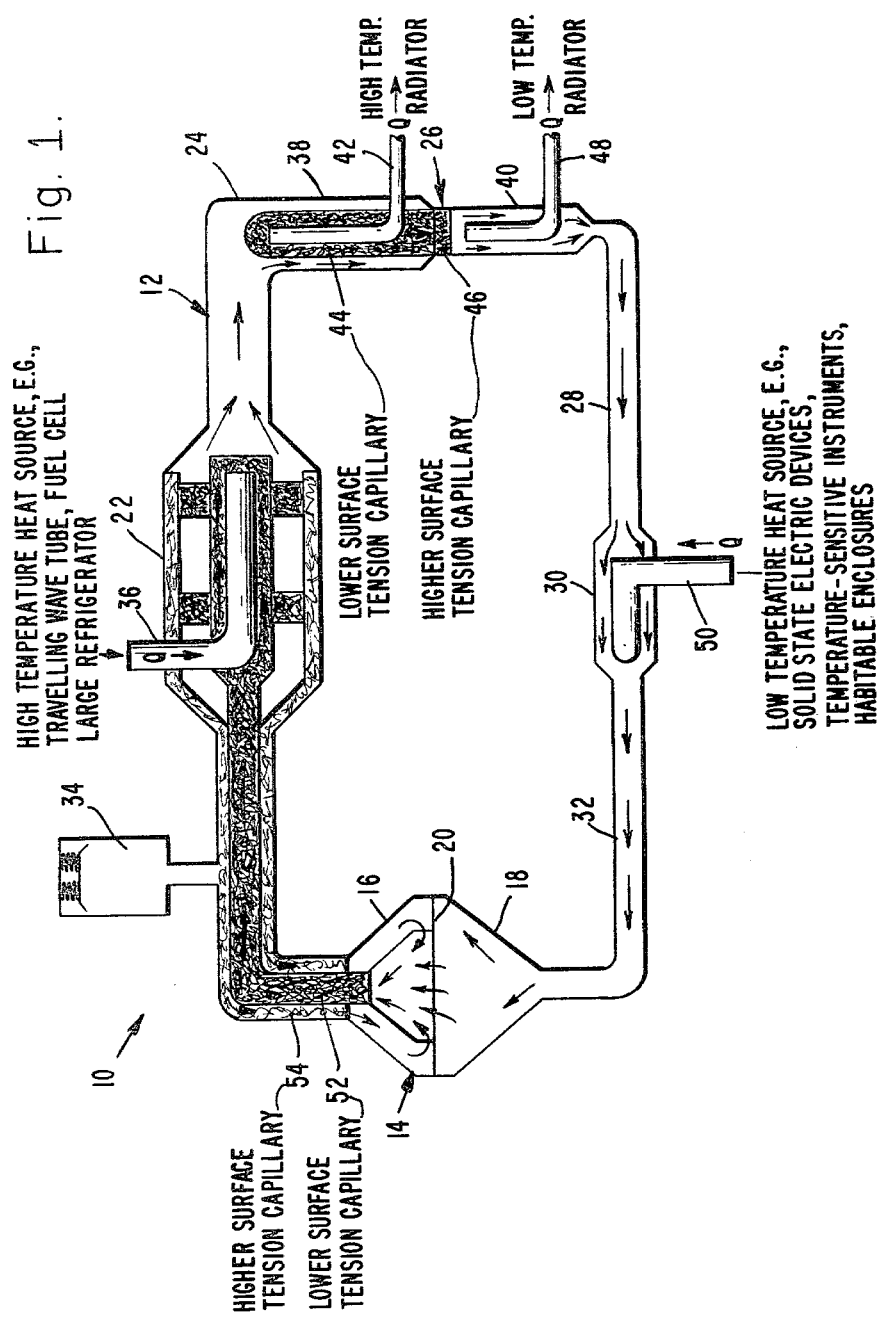

United States Patent [19]

Basiulis

[11] 4,312,402
[45] Jan. 26, 1982

[54] OSMOTICALLY PUMPED ENVIRONMENTAL CONTROL DEVICE

[75] Inventor: Algerd Basiulis, Redondo Beach, Calif.

[73] Assignee: Hughes Aircraft Company, Culver City, Calif.

[21] Appl. No.: 77,259

[22] Filed: Sep. 19, 1979

[51] Int. Cl.³ .............................................. F28D 15/00
[52] U.S. Cl. ...................... 165/104.22; 165/DIG. 12; 165/104.26; 417/207
[58] Field of Search ...................... 165/105, DIG. 12; 417/207

[56] References Cited

U.S. PATENT DOCUMENTS 3,677,337  7/1972  Midolo ................................ 165/105
4,081,023  3/1978  Edelstein ..................... 165/DIG. 12

FOREIGN PATENT DOCUMENTS 478171  10/1975  U.S.S.R. ............................. 165/105

Primary Examiner—Albert W. Davis
Attorney, Agent, or Firm—Lewis B. Sternfels; W. H. MacAllister

[57] ABSTRACT

An osmotically pumped environmental control system (10) comprises a closed circuit heat pipe (12) including an osmotic pump (13) with solvent and solution reservoirs (18, 14) separated from one another by a solvent permeable membrane (20). Heat is inserted into the closed path at an evaporator (22) from high temperature sources and heat is withdrawn from the system by first and second stage cooling modules (38, 40) to withdraw heat therefrom. A further heat input (30) from low temperature sources slightly warms the condensate for return to a solvent reservoir (18).

21 Claims, 4 Drawing Figures

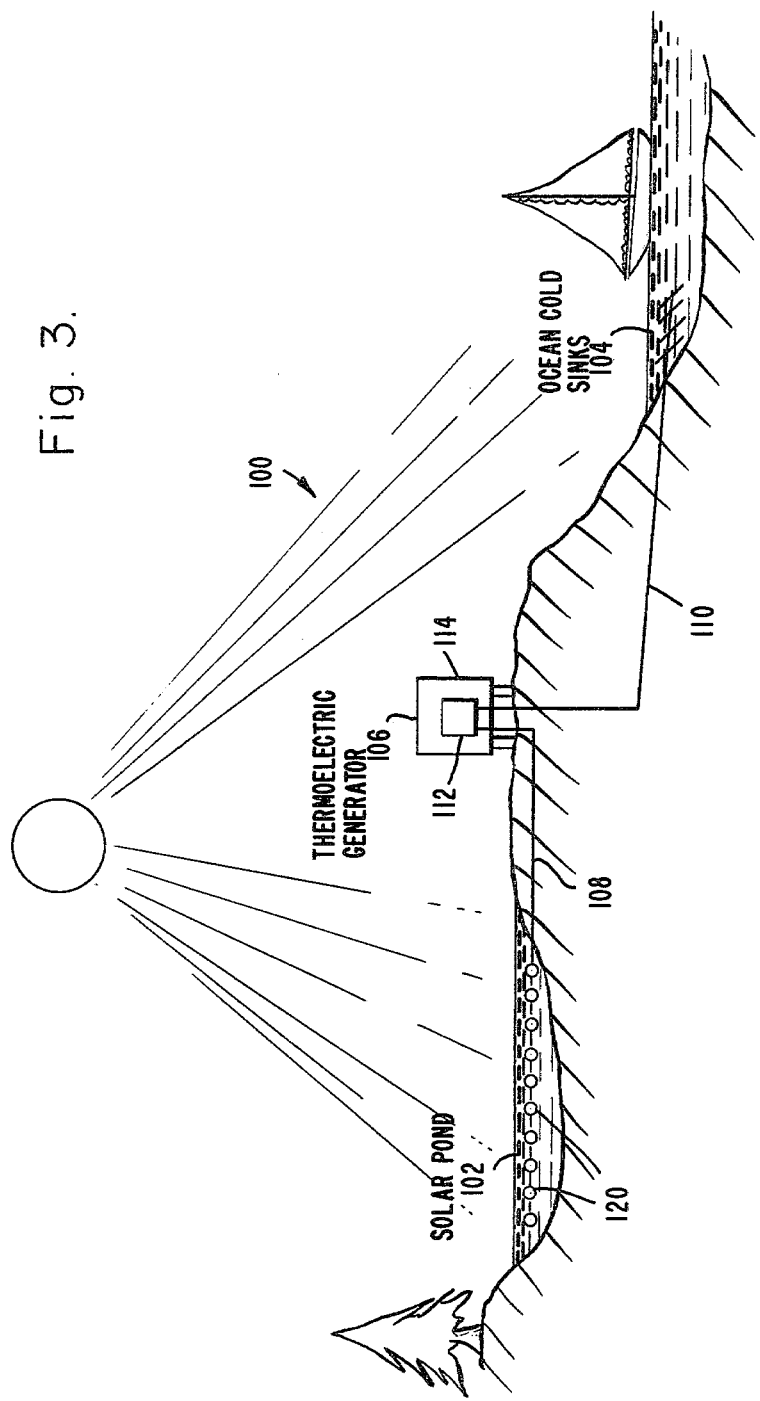

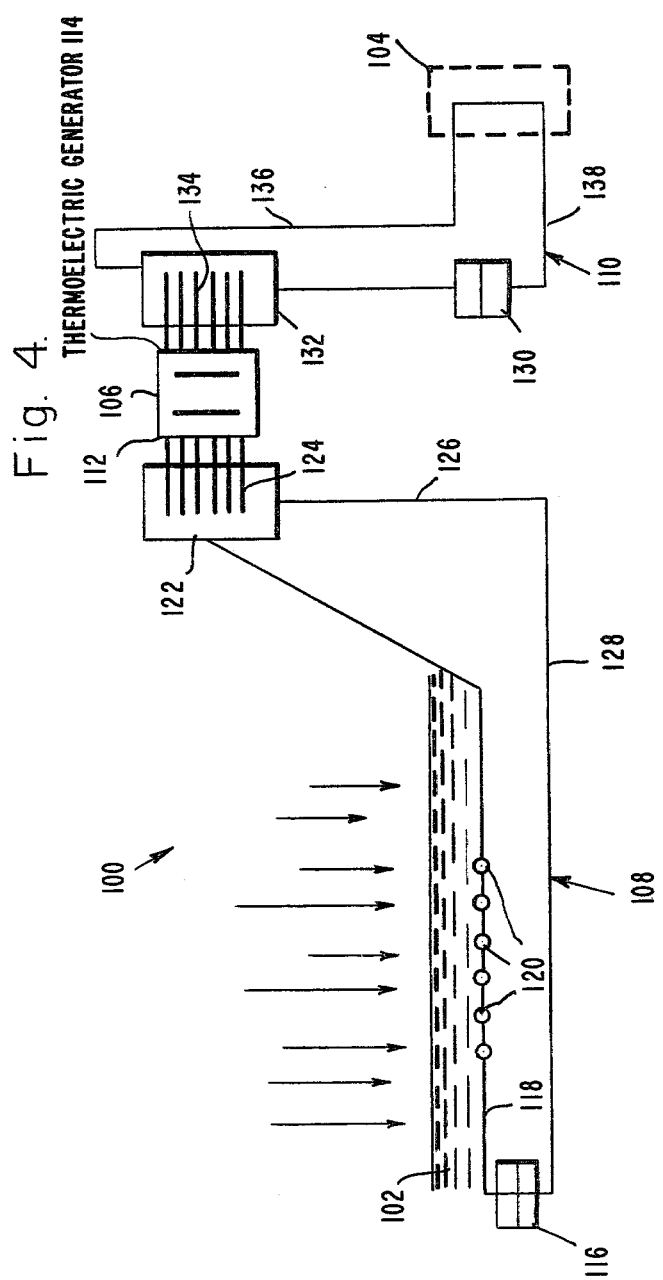

OSMOTICALLY PUMPED ENVIRONMENTAL CONTROL DEVICE

The present invention relates to an environmental control system and, in particular, to such a system which utilizes an osmotic pumped heat pipe usable in zero and very high gravity environments in which the driving energy comprises waste heat from electronic components, solor ponds, etc.

BACKGROUND ART

The utilization of waste heat has become an increasely important consideration in times where conservation of energy, especially fossil fuel energy, becomes increasely scarce and/or high priced.

In addition, present day communication and scientific satellites use conduction or radiation into space for rejecting waste heat. With increasing mission requirements and associated higher heat loads, a more efficient heat rejection system is needed. Heat pipes and pumped loops are sufficiently developed to meet increased heat load requirements; however, both of these systems have limitations. Heat pipes have a limited heat transport capacity, especially for very large radiators or in spinning satellites. Pumped loops are not limited by the size of the radiator network, but they do consume a considerable amount of power, and some components such as pumps and valves have limited reliability. Thus, there is a need for combining the versatility of pumped loops with the reliability and efficiency of a heat pipe.

SUMMARY OF THE INVENTION

The present invention meets these needs, while overcoming these and other problems, by providing for an osmotically pumped environmental control system utilizing a closed circuit heat pipe. It includes an osmotic pump and a means by which heat may be inserted into and withdrawn from the closed circuit so that waste heat from such sources as electronic components and solar ponds may be efficiently used, rather than simply discarded. For example, the heat pipe may be coupled to a thermo electric generator for production of electric energy.

It is, therefore, an object of the present invention to provide for a means by which waste heat may be utilized.

Another object is to provide for advantageous use of waste heat in zero as well as high gravity environments.

Another object is to provide for a system which is capable of operating for long distances.

Another object is to provide for a passively driven system.

Another object is to provide for such a system which does not consume otherwise useful sources of energy.

Another object is to provide for a reliable system.

Other aims and objects as well as a more complete understanding of the present invention will appear from the following explaination of exemplary embodiments and the accompanying drawings thereof.

BRIEF DESCRIPTION OF THE DRAWINGS

FIG. 1 is a view of an osmotically pumped environmental control system usable in zero gravity environments;

FIG. 2 depicts an embodiment of the invention usable for production of electrical energy;

FIG. 3 is an advanced embodiment of that illustrated in the FIG. 2 for additional use with a solar pond; and FIG. 4 is a view detailing the embodiment depicted in FIG. 3.

DETAILED DESCRIPTION OF THE INVENTION

In FIG. 1, an osmotically pumped environmental control system 10 comprises a closed circuit 12. The closed circuit includes an osmotic pump 14 having a solute-solvent mixture reservoir 16 and a solvent reservoir 18. A solvent permeable membrane 20 separates reservoirs 16 and 18 and evaporator 22 terminates the solute-solvent reservoir. Solvent vapor from the mixture or solution is generated in evaporator 22 and moves along a path 24 to be cooled and condensed in a heat rejection section 26 in which the condensate then traverses a path 28 through a heat exchanger 30 and along path 32 back to solvent reservoir 18. A solute reservoir 34 may be coupled to reservoir 16 for supply thereto of solute as needed.

In evaporator 22, a conventional homogeneous wick or grooved heat pipe 36 may be used to transport heat from such high temperature heat sources as travelling wave tubes (TWT's) or other high temperature devices to the evaporator. The heat input causes the solvent to evaporate from the solute-solvent mixture and the concentrated solution will return to reservoir 14. Solvent vapor will flow through path 24 to heat rejection section 26.

Section 26 includes first and second stage cooling modules 38 and 40. As shown, first stage module 38 includes a conventional heat pipe 42 for transporting heat from the solvent vapor away from module 38 to condense the vapor. A wick structure 44 within module 38 collects the condensate and transfers it, for example, through another wick 46 to second stage module 40 which is defined as a low temperature radiator section. As before, a conventional heat pipe 48 may be used to further cool the condensate.

Condensed solvent is then pumped by the osmotic pressure gradient past further heat exchanger 30 in which another conventional heat pipe 50 may be located. Heat exchanger 30 may be used to cool low temperature components such as solid state devices, temperature sensitive instrument or other electronic equipment, or habitable structures, such as a cabin in a space vehicle.

The solution may comprise a sucrose solution, e.g., 1 molal sugar in water solution, so that the solvent vapor produced in evaporator 22 would be at 100° C. which would be condensed to liquid form at approximately 100° C. in first stage cooling module 38. Second stage cooling module 40 would further lower the temperature of the condensate to about 50° C., which would be heated in exchanger 30 to approximately 70° C. for supply to the osmatic pump. These temperatures, of course, are given by way of example.

While the above description is useful for operation in a 1-g environment, some modifications are required for a 0-g environment. Specifically, transport of dilute and solute rich solution between solution reservoir 16 and evaporator 22 requires a modification such as depicted in FIG. 1. This separation is by means of a pair of flow paths defined by a 100 mesh path 52 for dilute solution and 10 mesh path 25 for a concentrated solution. Flow of the two solutions is founded upon the principle that liquid will flow in the direction of higher surface tension. The degree of surface tension is dependent upon the mesh size. As the mesh size decreases, such as from 100 mesh to 60 mesh, the surface tension increases. The same considerations adhere to condenser 26 and, therefore, mesh 44 may be 60 mesh while mesh 46 is 100 mesh.

Thus, if the system depicted in FIG. 1 were employed in a space vehicle, the waste heat from electronic equipment, whether of high power or low power, as well as the the cabin envoirnment may be controlled and used to advantage, rather than being simply wasted.

Figure 2:
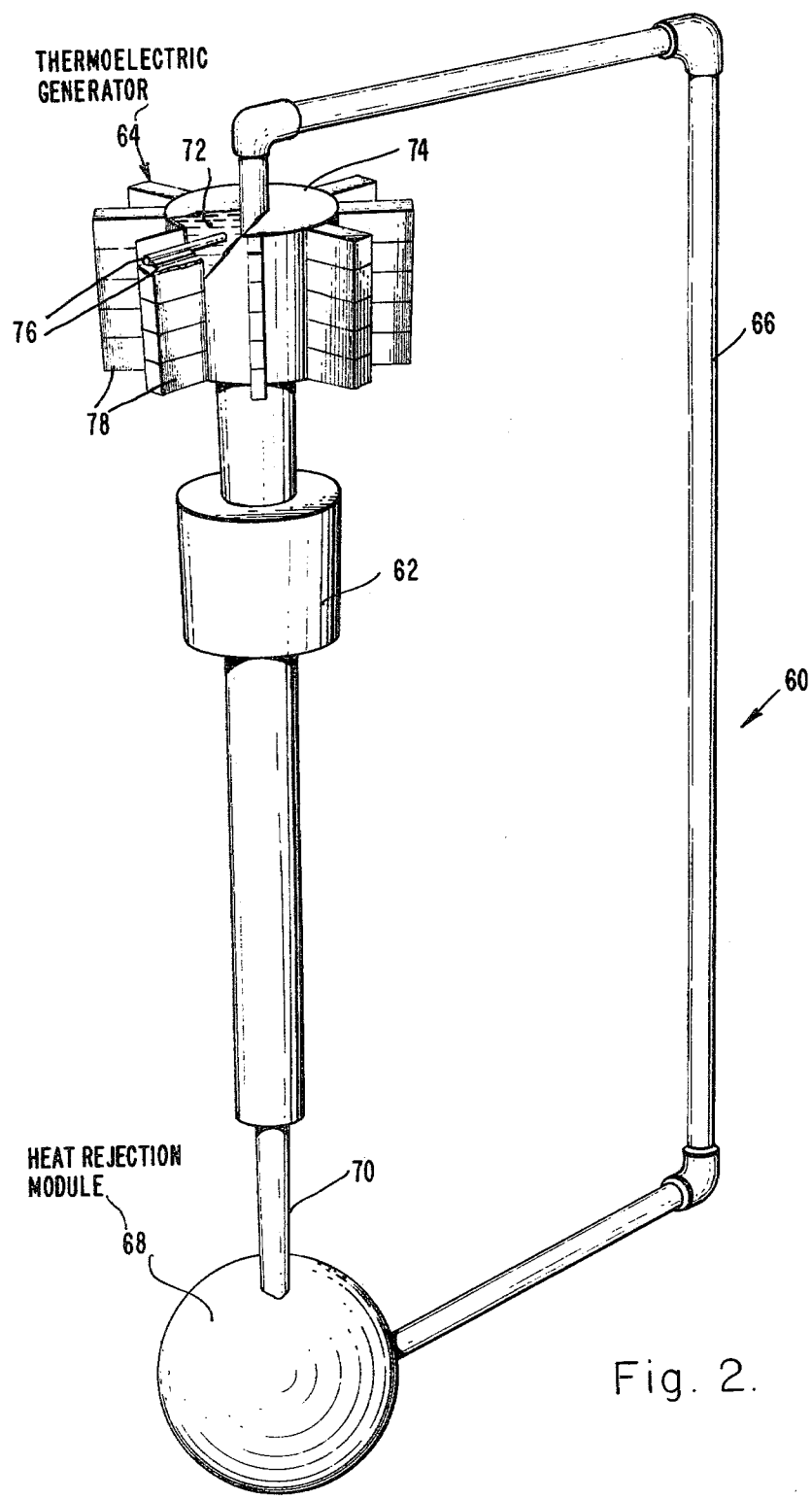

In a like manner, waste or unused sources of heat may be used to advantage. A simplified system is depicted in FIG. 2, in which a closed circuit heat pipe 60 includes an osmotic pump 62, a power generator module 64, a closed loop vapor path 66 leading to a heat rejection module or condenser 68, and a condensate path 70 to osmotic pump 62. The heat rejection module may be placed in a subcooling body, such as in an ocean or other large body of water.

Power generator module 64 includes a plurality of conventional heat pipes 72 extending outwardly from an evaporator 74. At their external portions, heat pipes 72 have thermoelectric generators 76 attached thereto and extending to fins 78 so that heat from warm water may be conveyed through fins 78 to heat pipes 72 through thermoelectric generators 76 which, in turn, transport the heat into reservoir 74 for production of solvent vapor from the solution therein.

A further use of the present invention is shown in FIGS. 3 and 4 in which separate heat and heat rejection sources are illustrated. Here, system 100 comprises a solar pond 102 as a source of heat from the sun and an ocean 104 as a cold sink. These two sources are coupled together through a thermoelectric generator 106 by a pair of closed circuit heat pipes 108 and 110. In this system, heat from heat pond 102 is furnished to the hot side 112 of thermoelectric generator 106 and this heat is transferred through the generator to its cold side 114.

Specifically as shown in FIG. 4, closed path heat pipe 108 comprises an osmotic pump 116 which communicates from its solution reservoir side to an evaporator 118. Evaporator 118 is depicted as including a plurality of conventional heat pipes 120 having one of their ends in the evaporator and the other of their ends in the solar pond. The heat from the solar pond vaporizes solvent from the solution, and the solvent vapor is then forwarded to condenser 122 at the hot side of generator 106. The heat in the solvent vapor is transported by, for example, a plurality of conventional heat pipes 124 to hot side 112 of thermoelectric generator 106. As the vapor gives up this heat, the resulting condensate flows along paths 126 and 128. Path 126 may be considered as moving through the earth somewhat distanced from solar pond 102 while path 128 may be considered as passing through earth adjacent to the solor pond or at lower levels of the solar pond to act as an input of heat in a manner similiar to that shown with respect to FIG. 1 and its heat exchanger 30.

Closed path heat pipe 110 operates in a similar manner and includes an osmotic pump 130 coupled at its solution reservoir with an evaporator 132, which is coupled to the cold side of generator 106 by a plurality of heat pipes 134. Heat from the thermoelectric generator vaporizes solvent from the solution in evaporator 132 and the solute vapor flows along a path 136 to a condenser 104 which, as shown in FIG. 3, comprises a body of water, such as a lake or an ocean. As a cold sink, condenser 104 condenses vapor and the condensed solute follows a path 138 back to osmotic pump 130.

Although the invention has been described with reference to particular embodiments thereof, it should be realized that various changes and modifications may be made therein without departing from the spirit and scope of the invention.

I claim:

1. An osmotically pumped environmental control system comprising a closed circuit heat pipe including an osmotic pump with solvent and solute-solvent mixture reservoirs separated from one another by a solvent permeable membrane and means for inserting heat into and for withdrawing heat from said closed circuit heat pipe, in which said heat inserting means is coupled to sources of waste heat for transferring heat produced thereby to said closed circuit and in which said heat withdrawing means comprises at least a pair of cooling stages in series respectively for condensing said solvent vapor into a condensate and for cooling said condensate.

2. An osmotically pumped environmental control system comprising at least high and low temperature sources of waste heat, a closed circuit heat pipe including an osmotic pump with solvent and solute-solvent mixture reservoirs separated from one another by a solvent permeable membrane, means for withdrawing heat from said closed circuit heat pipe, and individual high and low temperature heat transfer devices coupling said high and low temperature sources respectively to said closed circuit at points thereof separated by said heat withdrawing means.

3. A control system according to claim 2 wherein said solute-solvent mixture reservoir is terminated by an evaporator coupled to said high temperature heat transfer device for producing a solvent vapor from said solute-solvent mixture.

4. A control system according to claim 3 in which said heat withdrawing means comprises at least a pair of cooling stages in series respectively for condensing said solvent vapor into a condensate and for cooling said condensate.

5. A control system according to claim 4 further including wicks respectively coupled to said condensing stage and between said pair of stages, said latter wick having means for providing higher surface tension than said former wick.

6. A control system according to claim 3 further including means coupling said membrane and said evaporator and defining relatively high and low surface tension paths for flow of said solute-solvent mixture when diluted with said solvent osmatically pumped through said membrane and when concentrated from production of said solvent vapor.

7. A control system according to claim 6 in which said relative and low surface tension paths comprise differently sized meshes further for removing freshly pumped solvent from said membrane.

8. A control system according to claim 2 wherein said high temperature source comprises at least one travelling-wave tube.

9. A control system according to claim 2 wherein said high temperature source comprises at least one fuel cell.

10. A control system according to claim 2 wherein said high temperature source comprises at least one large refrigerator.

11. A control system according to claim 2 wherein said low temperature source comprises at least one solid-state electric device.

12. A control system according to claim 2 wherein said low temperature source comprises at least one temperature-sensitive instrument.

13. A control system according to claim 2 wherein said low temperature source comprises at least one habitable enclosure.

14. A control system according to claim 2 in which said high and low temperature sources respectively comprise upper and lower levels of a solar pond.

15. A control system according to claim 14 further comprising a second closed circuit heat pipe including a second osmotic pump with solvent and solute-solvent mixture reservoirs separated from one another by a solvent permeable membrane, at least a second high temperature source coupled to said second closed circuit heat pipe for inserting heat therein, second heat withdrawing means coupled between said second closed circuit heat pipe and a cold sink, and a thermoelectric generator having a hot side coupled to said heat withdrawing means of said first-mentioned closed circuit heat pipe and a cold side coupled to said second high temperature souce.

16. An osmotically pumped environmental control system comprising a closed circuit heat pipe including an osmotic pump with solvent and solute-solvent mixture reservoirs separated from one another by a solvent permeable membrane, means for withdrawing heat from said closed circuit heat pipe, and heat pipes coupled between said closed circuit heat pipe and thermoelectric generators for transferring heat produced thereby to said closed circuit.

17. In a heat pipe system comprising a closed circuit heat pipe including a working fluid and means for inserting heat into and for withdrawing heat from said closed circuit heat pipe, the improvement in which said heat withdrawing means comprises at least a pair of cooling stages in series respectively for condensing vapor from said working fluid into a condensate and for cooling said condensate.

18. A heat pipe system according to claim 17 in which said pair of cooling stages respectively comprise wick paths having means for providing respective larger and smaller surface tension therein.

19. In an osmotic pumped heat pipe having solution and solvent reservoirs, solvent permeable membrane material separating said reservoirs and an evaporator coupled to said solution reservoir for producing solvent vapor from solution in said solution reservoir, the improvement in maintaining a first flow of lean solution from said evaporator to said membrane material and a second flow of rich solution from said membrane material to said evaporator comprising respective higher and lower surface tension paths respectively for said first and second flows.

20. The improvement according to claim 19 wherein said first and second paths respectively comprise material of greater and smaller mesh.

21. A method for maintaining flow of solution between an evaporator and solvent permeable membrane material in an osmotically pumped heat pipe comprising the step of separating the solution into lean and rich components through respective higher and lower surface tension paths between the evaporator and the membrane material.

* * * * *